US011128309B2

United States Patent
Su et al.

(10) Patent No.: US 11,128,309 B2
(45) Date of Patent: Sep. 21, 2021

(54) DIGITAL CALIBRATION METHOD, DIGITAL CALIBRATION DEVICE AND TRUE RANDOM NUMBER GENERATOR CIRCUIT

(71) Applicant: Shenzhen Goodix Technology Co., Ltd., Guangdong (CN)

(72) Inventors: Yuan Su, Guangdong (CN); Xiang Fang, Guangdong (CN); Zheng Li, Guangdong (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/122,034

(22) Filed: Dec. 15, 2020

(65) Prior Publication Data

US 2021/0167788 A1   Jun. 3, 2021

Related U.S. Application Data

(63) Continuation of application No. PCT/CN2019/111051, filed on Oct. 14, 2019.

(51) Int. Cl.
*H03M 1/10* (2006.01)
*G06F 7/58* (2006.01)
*H03M 1/06* (2006.01)
*H03K 3/84* (2006.01)

(52) U.S. Cl.
CPC .......... *H03M 1/1009* (2013.01); *G06F 7/588* (2013.01); *H03M 1/0607* (2013.01); *H03K 3/84* (2013.01)

(58) Field of Classification Search
CPC .... H03M 1/1009; H03M 1/0607; H03M 1/12; G06F 7/588; H03K 3/84

USPC ........................................ 341/118, 120, 161
See application file for complete search history.

(56) References Cited

U.S. PATENT DOCUMENTS

| 8,031,092 B1* | 10/2011 | Sun ..................... H03M 1/1033 341/120 |
| 8,766,832 B1* | 7/2014 | Bogue ................. H03M 1/1004 341/120 |
| 2019/0222218 A1 | 7/2019 | Farid et al. |

FOREIGN PATENT DOCUMENTS

| CN | 104461457 A | 3/2015 |
| CN | 107797789 A | 3/2018 |
| CN | 104317552 B | 4/2018 |
| CN | 106155628 B | 12/2018 |
| CN | 208999990 U | 6/2019 |
| CN | 110061743 A | 7/2019 |
| CN | 110138384 A | 8/2019 |
| CN | 110149117 A | 8/2019 |

* cited by examiner

*Primary Examiner* — Khai M Nguyen
(74) *Attorney, Agent, or Firm* — Forge IP, PLLC (57) ABSTRACT

A digital calibration method, a device, and a true random number generator circuit are provided. In one aspect, the embodiment of the present disclosure uses the digital calibration method to calibrate compensation of a circuit to be calibrated, output of the circuit to be calibrated is sampled and tested multiple times, and whether a current test compensation calibration code value can make the circuit to be calibrated meet specified accuracy is judged based on a probability that the output result is a target result. Through sampling the output of the circuit to be calibrated multiple times, the selected compensation calibration code has higher accuracy.

13 Claims, 7 Drawing Sheets

DIGITAL CALIBRATION METHOD, DIGITAL CALIBRATION DEVICE AND TRUE RANDOM NUMBER GENERATOR CIRCUIT

CROSS REFERENCE TO RELATED APPLICATIONS

The present application is a continuation of international application No. PCT/CN2019/111051, filed on Oct. 14, 2019, which is hereby incorporated by reference in its entirety.

TECHNICAL FIELD

The present disclosure relates to the technical field of analog-to-digital converters and, in particular, to a digital calibration method, a digital calibration device and a true random number generator circuit.

BACKGROUND

An analog-to-digital converter (ADC) refers to a component that converts continuously changing analog signals to discrete digital signals. Since the analog-to-digital converter will have conversion errors, output results will have errors, and it is necessary to calibrate the error of the analog-to-digital converter. The error of the analog-to-digital converter includes a compensation parameter (offset), in application scenarios such as using the ADC to form a true random number generator (TRNG) circuit, it is important to calibrate the compensation parameter of the ADC, magnitude of the error of the compensation parameter will have an essential impact on randomness of the random number output by the true random number generator circuit, and currently, the calibration accuracy of the calibration circuit for the ADC compensation parameter is relatively low. Thus, more accurate calibration for the compensation parameter is an urgent problem to be solved at present.

SUMMARY

In view of this, embodiments of the present disclosure provide a digital calibration method, a digital calibration device and a true random number generator circuit, to solve the problem of low calibration accuracy of the circuit for calibrating compensation in the prior art.

In one aspect, an embodiment of the present disclosure provides a digital calibration method. The method included: in a case where a circuit to be calibrated is in a calibration mode, selecting a first value from a first range as a test compensation calibration code value for a current test, where the circuit to be calibrated is a comparator or operational amplifier of an analog-to-digital converter, and a common mode voltage is provided to a non-inverting input terminal and an inverting input terminal of the circuit to be calibrated; inputting the test compensation calibration code value to a compensation calibration code input terminal of the circuit to be calibrated; sampling output of the circuit to be calibrated specified times; counting a number of times when the output of the circuit to be calibrated is a target result within the specified times, to obtain a second value; judging whether the second value is within a second range; and if the second value is within a second range, taking the test compensation calibration code value as a compensation calibration code of the circuit to be calibrated in an operating mode.

The above aspect and any possible implementation manner further provide an implementation manner, the method further includes: if the second value is not within a second range, selecting a third value from the first range in a preset order as a test compensation calibration code value for a next test, until the second value is within the second range.

The above aspect and any possible implementation manner further provide an implementation manner, prior to the selecting the third value from the first range in the preset order as the test compensation calibration code value for the next test, the method further includes: judging whether second values obtained in two adjacent tests are located at different sides of the second range; and if the second values obtained in the two adjacent tests are located at different sides of the second range, taking a test compensation calibration code value of a previous test of the two adjacent tests as the compensation calibration code of the circuit to be calibrated in the operating mode.

The above aspect and any possible implementation manner further provide an implementation manner, the method further includes: if the second values obtained in the two adjacent tests are not located at different sides of the second range, selecting the third value from the first range in the preset order as the test compensation calibration code value for the next test.

The above aspect and any possible implementation manner further provide an implementation manner, when the calibration mode is triggered by a target signal, the selecting the first value from the first range as the test compensation calibration code value of the test for the current test includes: counting a number of times when the target signal is received after power-on, to obtain a fourth value; setting the first value to be a pre-specified initial value in a case where the fourth value is not greater than 1; and selecting a next value corresponding to a current compensation calibration code from the first range in the preset order as the test compensation calibration code value for the current test in a case where the fourth value is greater than 1.

The above aspect and any possible implementation manner further provide an implementation manner, the circuit to be calibrated is a comparator or operational amplifier of one of a plurality of analog-to-digital converters of a pipelined analog-to-digital converter circuit, and when a calibration mode enable terminal of the pipelined analog-to-digital converter circuit receives the target signal, all circuits to be calibrated of the pipelined analog-to-digital converter circuit enter a to-be-calibrated mode synchronously.

The above aspect and any possible implementation manner further provide an implementation manner, prior to the judging whether the second value is within the second range, the method further includes: determining an upper threshold and a lower threshold of the second range based on a preset error and a number of the specified times.

The above aspect and any possible implementation manner further provide an implementation manner, the test compensation calibration code value comprises a plurality of calibration bits and a symbol identification bit, wherein the plurality of calibration bits indicates numerical magnitude of the test compensation calibration code value, and the symbol identification bit indicates positive or negative of the test compensation calibration code value.

In another aspect, an embodiment of the present disclosure provides a digital calibration device. The digital calibration device includes: a selection module configured to select, in a case where a circuit to be calibrated is in a calibration mode, a first value from a first range as a test compensation calibration code value for a current test, the circuit to be calibrated being a comparator or operational amplifier of an analog-to-digital converter, a common mode voltage being provided to a non-inverting input terminal and an inverting input terminal of the circuit to be calibrated in the case where the circuit to be calibrated is in the calibration mode; an input module configured to input the test compensation calibration code value to a compensation calibration code input terminal of the circuit to be calibrated; a sampling module configured to sample output of the circuit to be calibrated specified times; a counting module configured to count a number of times when the output of the circuit to be calibrated is a target result within the specified times, to obtain a second value; a judgment module configured to judge whether the second value is within a second range; and a logic module configured to take the test compensation calibration code value as a compensation calibration code of the circuit to be calibrated in an operating mode if the second value is within a second range.

The above aspect and any possible implementation manner further provide an implementation manner, the device further includes an execution module configured to select a third value from the first range in a preset order as a test compensation calibration code value for a next test until the second value is within the second range if the second value is not within a second range.

In still another aspect, an embodiment of the present disclosure provides a true random number generator circuit. The true random number generator circuit includes: a pipelined analog-to-digital converter circuit, where the pipelined analog-to-digital converter circuit includes a plurality of analog-to-digital converters connected in a pipelined connection manner, each of the plurality of analog-to-digital converters includes a plurality of circuits to be calibrated, and each of the plurality of circuits to be calibrated is a comparator or operational amplifier; a digital calibration device connected to each of the plurality of circuits to be calibrated and configured to execute the digital calibration method for each of the plurality of circuits to be calibrated; and an output circuit connected to outputs of the plurality of analog-to-digital converters and configured to output a true random number based on output signals of the plurality of analog-to-digital converters.

The above aspect and any possible implementation manner further provide an implementation manner, and each of the analog-to-digital converters further includes: a first calibration logic circuit configured to, when a calibration mode enable terminal receives a target signal, provide the common-mode voltage to a non-inverting input terminal and an inverting input terminal of each of the plurality of operational amplifiers in such a manner that each of the plurality of operational amplifiers is in a calibration mode; and a second calibration logic circuit configured to, when the calibration mode enable terminal receives the target signal, provide the common mode voltage to a non-inverting input terminal and an inverting input terminal of each of the plurality of comparators in such a manner that each of the plurality of comparators is in the calibration mode.

The above aspect and any possible implementation manner further provide an implementation manner, the digital calibration device includes a plurality of digital calibration modules respectively connected to the plurality of circuits to be calibrated in one-to-one correspondence, and each of the plurality of digital calibration modules is configured to execute the digital calibration method for a correspondingly connected circuit to be calibrated of the plurality of circuits to be calibrated.

One of the above technical solutions has following beneficial effects.

The compensation of the circuit to be calibrated is calibrated through the digital calibration method. The output of the circuit to be calibrated is sampled and tested multiple times, and whether the current test compensation calibration code value can make the circuit to be calibrated meet specified accuracy or not is judged according to a probability that the output result is the target result. Through sampling and testing the output of the circuit to be calibrated multiple times, the selected compensation calibration code has higher accuracy, thereby solving the problem of the low calibration accuracy of the circuit for calibrating compensation in the prior art.

BRIEF DESCRIPTION OF DRAWINGS

In order to more clearly illustrate technical solutions of embodiments of the present disclosure, the accompanying drawings used in the embodiments are briefly described below. Obviously, the drawings described below are merely a part of the embodiments of the present disclosure. For those of ordinary skill in the art, other drawings can be obtained from these drawings without creative work.

DESCRIPTION OF EMBODIMENTS

In order to better understand the technical solutions of the present disclosure, the embodiments of the present disclosure are described in detail with reference to the drawings.

It should be clear that the described embodiments are merely part of the embodiments of the present disclosure rather than all of the embodiments. Based on the embodiments in the present disclosure, all other embodiments obtained by those skilled in the art without paying creative labor shall fall into the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to include a plural form.

It should be understood that the term "and/or" as used herein is merely an association describing the associated object, indicating that there can be three relationships. For example, A and/or B may indicate three cases: A alone; A and B; B alone. In addition, a character "/" herein generally indicates that the contextual objects are in an "or" relationship.

It should be understood that although the terms first, second, third, etc. can be used to describe XXX in the embodiments of the present disclosure, these XXX should not be limited to these terms. These terms are only used to distinguish XXX from each other. For example, without departing from the scope of the embodiments of the present disclosure, the first XXX can also be referred to as the second XXX, and similarly, the second XXX can also be referred to as the first XXX.

Depending on the context, the word "if" as used herein can be interpreted as "when" or "at the time of" or "in response to determination" or "in response to detection". Similarly, depending on the context, the phrase "if it is determined that" or "if it is detected that (stated condition or event)" can be interpreted as "when it is determined that" or "in response to the determination that" or "when it is detected that (stated condition or event))" or "in response to the detection that (stated condition or event)".

Embodiment One

Figure 1:
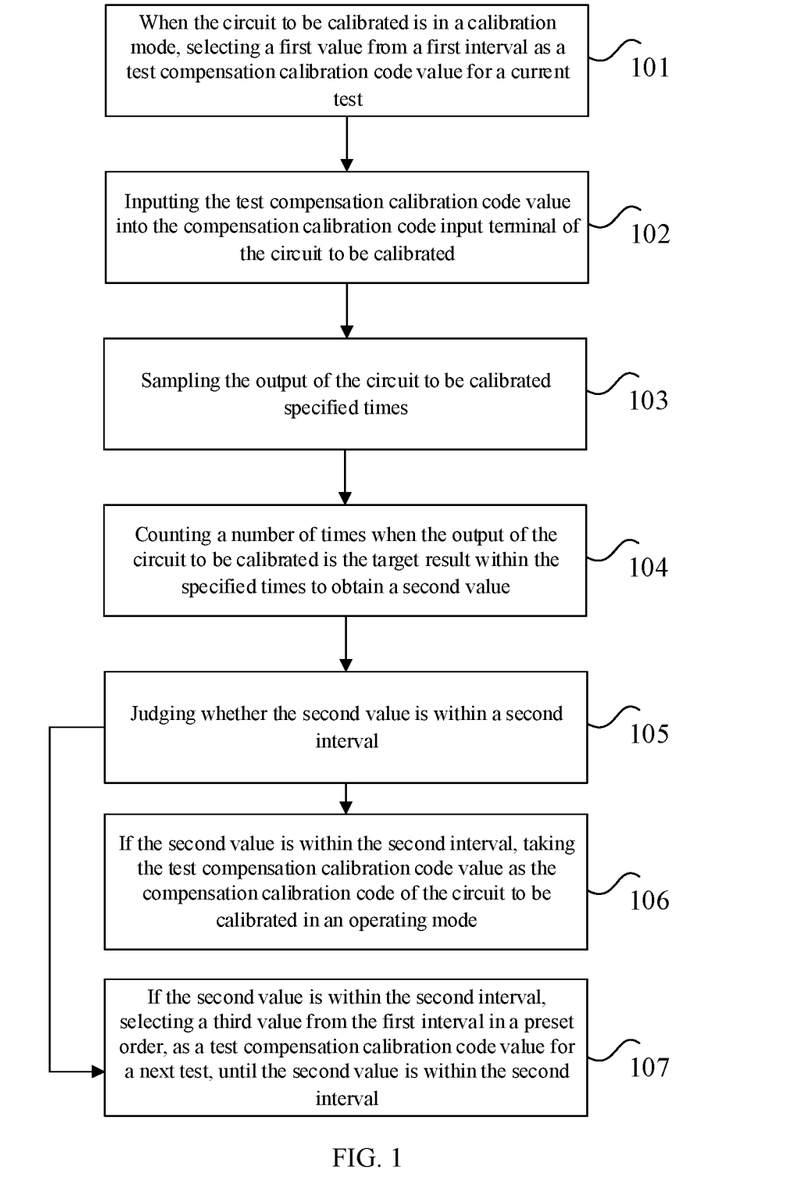
FIG. 1 is a flowchart of a digital calibration method provided by an embodiment of the present disclosure.

An embodiment of the present disclosure provides a digital calibration method, for calibrating a compensation parameter of a circuit to be calibrated (it should be noted that, in some embodiments of the present disclosure, the compensation parameter can be referred to as offset), to determine a compensation calibration code. The circuit to be calibrated is a comparator or operational amplifier, and for these gain electronic devices, there may be a certain shift before and after performing a gaining, the compensation parameter is equivalent to shift before the gaining, and determining a compensation parameter that minimizes an error of the circuit to be calibrated is equivalent to calibrating the compensation parameter of the circuit to be calibrated. The compensation calibration code (value) is a compensation parameter expressed in digital signal. FIG. 1 is a schematic diagram of a flowchart of the digital calibration method provided by an embodiment of the present disclosure. As shown in FIG. 1, the method includes following steps.

At step 101, when the circuit to be calibrated is in a calibration mode, a first value is selected from a first range as a test compensation calibration code value for a current test.

The circuit to be calibrated is a comparator or operational amplifier of an analog-to-digital converter, and when the circuit to be calibrated is in the calibration mode, a common mode voltage is provided to a non-inverting input terminal and an inverting input terminal of the circuit to be calibrated.

Optionally, the test compensation calibration code value includes a plurality of calibration bits and one symbol identification bit, the plurality of the calibration bits indicates numerical magnitude of the test compensation calibration code value, and the symbol identification bit indicates positive or negative of the test compensation calibration code value. Each of the calibration bit and the symbol identification bit is binary. The first range is a preset numerical range, for example, [−15, +15], which can be expressed in binary as [11111, 01111], where the highest bit indicates positive or negative of a sign, 0 indicates positive, 1 indicates negative, and the last four bits indicate the numerical magnitude.

Optionally, the first value can be selected according to the number of times of the calibrations after power-on, and in a case where the first calibration is performed after the power-on (power-on calibration), a default value can be selected as the first value, such as 0, and in a case where multiple calibrations have been performed after the power-on (real-time calibration), the first value can be determined according to the compensation calibration code determined last time in a state of the calibration mode.

For example, an optional implementation of the step of selecting the first value from the first range as the test compensation calibration code value for the current test includes: counting the number of times when a target signal is received after the power-on, to obtain a fourth value; setting the first value to be a pre-specified initial value in a case where the fourth value is not greater than 1; and selecting a next value corresponding to a current compensation calibration code from the first range in the preset order as the test compensation calibration code value for the current test in a case where the fourth value is greater than 1.

At step 102, the test compensation calibration code value is input into the compensation calibration code input terminal of the circuit to be calibrated.

The circuit to be calibrated includes the compensation calibration code input terminal configured to receive the compensation calibration code, the compensation calibration code is a current output by an executor of the present embodiment, and the compensation calibration code is used to compensate, in the form of a current, the circuit to be calibrated, so as to affect output of the circuit to be calibrated, which causes that a result output at the time when the compensation calibration code is input to the circuit to be calibrated may be different from result output when the compensation calibration code is not input to the circuit to be calibrated.

At step 103, the output of the circuit to be calibrated is sampling specified times.

In the case of the calibration mode, the output of the circuit to be calibrated is sampled multiple times for each test compensation calibration code value, and then based on results of the multiple samplings, whether a current test compensation calibration code value can make accuracy of the circuit to be calibrated meet the condition or not is judged.

At step 104, the number of times when the output of the circuit to be calibrated is the target result within the specified times is counted to obtain a second value.

The circuit to be calibrated is a comparator or operational amplifier of an analog-to-digital converter, and when the circuit to be calibrated is in the calibration mode, theoretical probabilities that the output value is 0 and 1 are respectively 0.5, that is, in an ideal case, the number of times when the result is 0 in the N times of sampling is N/2, and the number of times when the result is 1 is N/2. However, due to reasons such as mismatch and noise of components of the circuit, the number of times when the output result is the target result (for example, 0) will be different from the ideal number of times (N/2), thus, by counting whether the number of times when the output result is the target result is within a specified range, it can be determined whether the current test compensation calibration code can make the accuracy of the circuit to be calibrated reach a preset accuracy.

At step 105, whether the second value is within a second range is judged.

The second range is a specified range, which is a numerical range specified and set in advance. Optionally, the second range can be calculated based on the specified number N of times of sampling and the pre-specified number M of times of an error (preset error), for example, the range of the second range is (N/2−M, N/2+M).

At step 106, if the second value is within the second range, the test compensation calibration code value is taken as the compensation calibration code of the circuit to be calibrated in an operating mode.

If the second value is within the second range, it indicates that the test compensation calibration code value used in the current test can make the circuit to be calibrated meet the preset accuracy. Therefore, the current test compensation calibration code value is taken as the compensation calibration code of the circuit to be calibrated in the operating mode.

Optionally, the circuit to be calibrated can be a comparator or operational amplifier of one of the multiple analog-to-digital converters of a pipelined analog-to-digital converter circuit. In a case where a calibration mode enable terminal of the pipelined analog-to-digital converter circuit receives the target signal, all circuits to be calibrated in the pipelined analog-to-digital converter circuit enter a to-be-calibrated mode synchronously, and the step 101 to step 107 can be synchronously performed by all circuits to be calibrated, until each circuit to be calibrated determines the compensation calibration code in the operating mode.

At step 107, if the second value is within the second range, a third value is selected from the first range in a preset order, as a test compensation calibration code value for a next test, until the second value is within the second range.

That is, if the output result (the second value) obtained in the test is not in the second range, then another value (that is, the third value) in the first range is selected in the preset order, and the third value is taken as the test compensation calibration code value, to carry out the next test, until the output result (the second value) obtained by the test is in the second range.

The preset order can be stepwise, such as adding 1 to or subtracting 1 from the value. For example, after the power-on, the initial test compensation calibration code value is taken as 0, and after that, in a case where the second value is not within the second range, the compensation calibration code value will be incremented by 1 by default, until an upper limit of the first range, i.e., +15, and decreasing by 1 from 0 in a reverse direction, until a lower limit of the first range, i.e., −15. Optionally, after the compensation calibration code is determined, in addition to storing the compensation calibration code, a stepwise direction of the current preset order can be stored, and when in the calibration mode next time (real-time calibration), the stepwise direction of the preset order is determined according to the last stored stepwise direction.

Optionally, since the values in the first range are not continuous, it is possible that the second value cannot be iterated into the second range. If two adjacent values are used as the test compensation calibration code values and the second values obtained fall at two sides (different sides) of the second range, it is indicated that the second value cannot further converge within the second range, and the test of the compensation calibration code can be stopped, to jump out the test loop. For example, when the first values are respectively 2 and 3, the second value are respectively 420 and 580, the test results obtained by two adjacent test compensation calibration code values respectively fall at two sides of the second range [450, 550] (the specified number of times is 1000, and the specified number of times of error is 50), the second value cannot converge any more, thus, at this time, the current test compensation calibration code value can be used as the compensation calibration code of the circuit to be calibrated in the operating mode, and the testing of the compensation calibration code is stopped.

Figure 2:
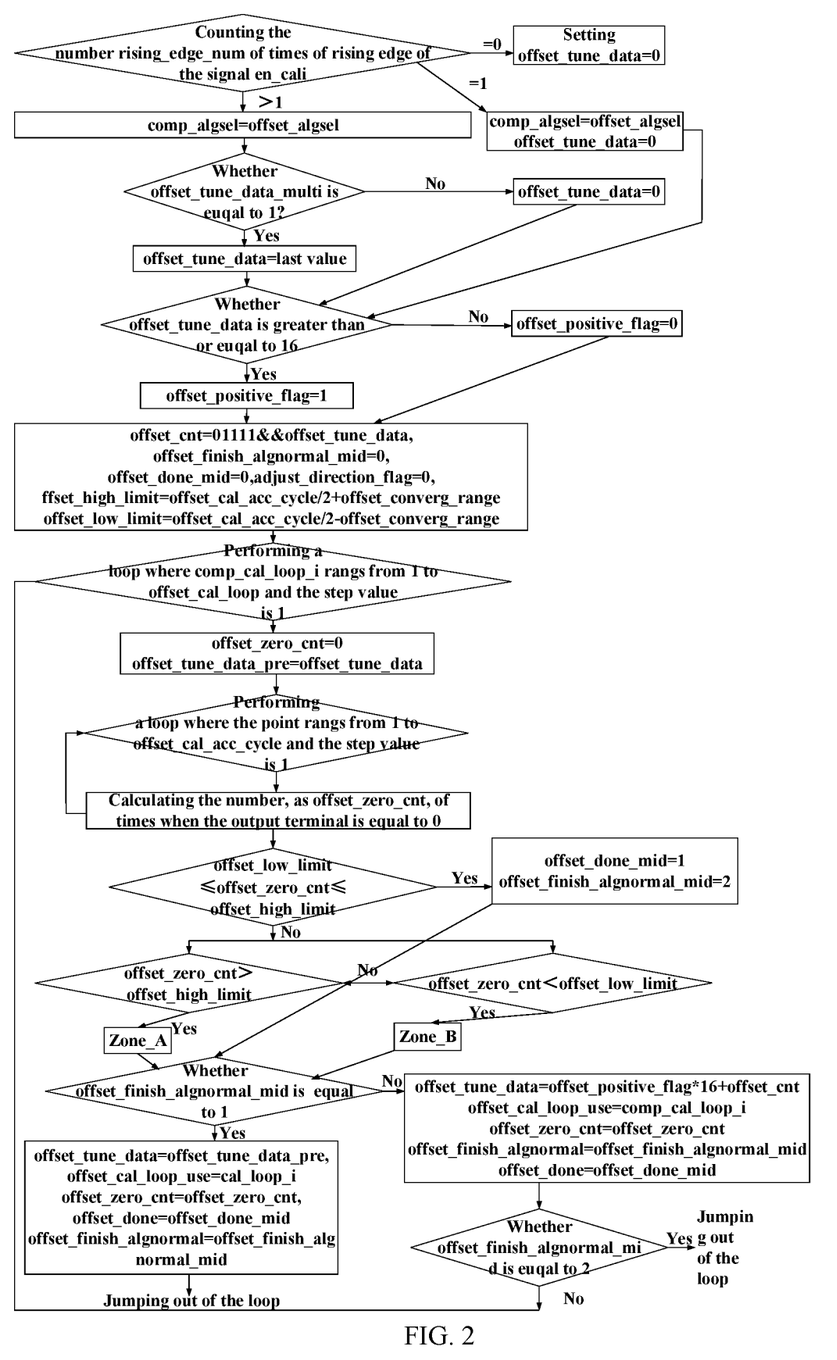
FIGS. 2 to 4 are flowcharts of a digital calibration method provided by embodiments of the present disclosure.
Figure 3:
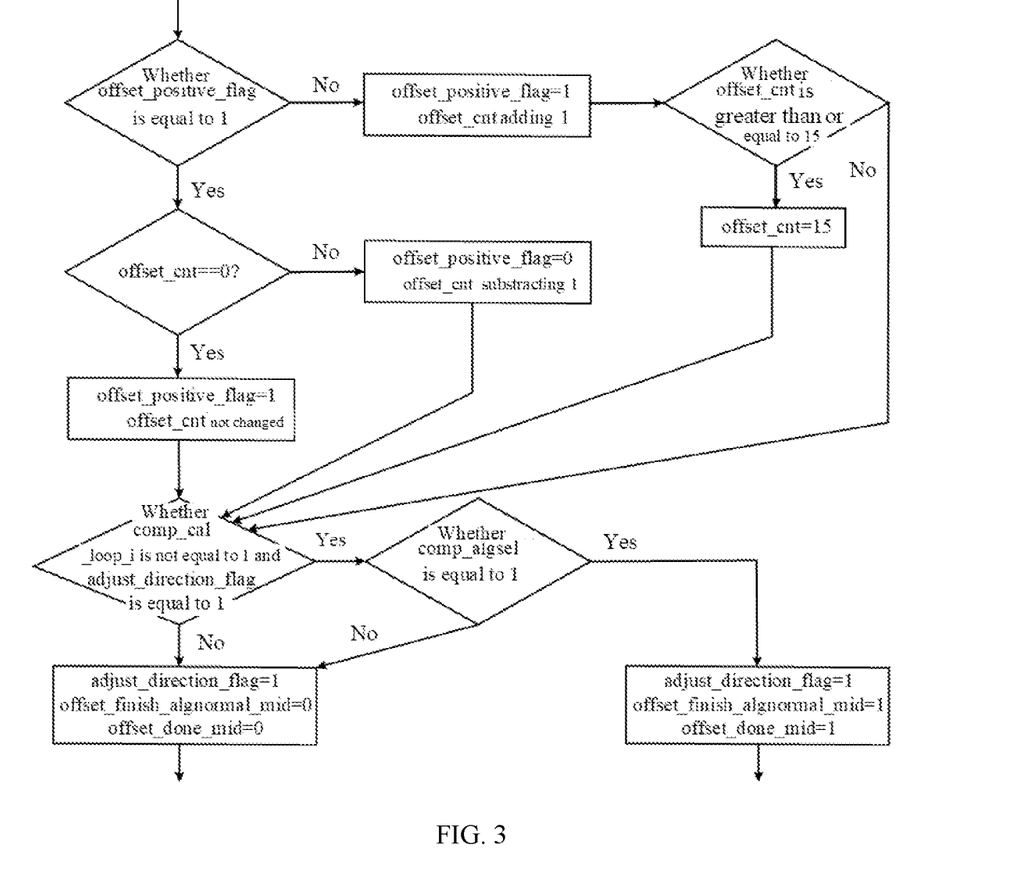
Figure 4:
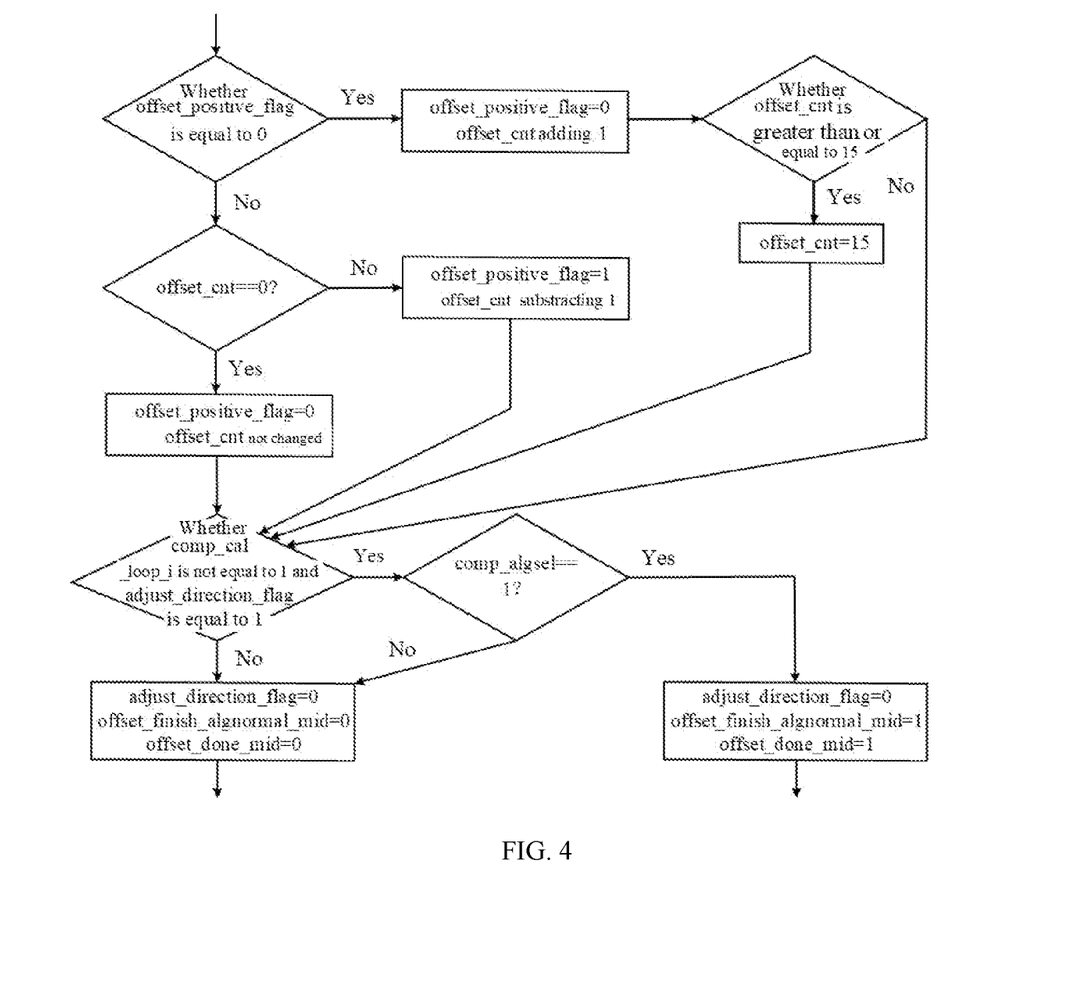

The digital calibration method provided in the present embodiment can be programmed using VHDL, and, based on the digital calibration method provided in the present embodiment, a code logic of an alternative digital calibration method is provided, as shown in FIGS. 2 to 4:

(1) a signal en_cali is a target signal used to make the circuit to be calibrated enter the calibration mode, a rising edge of the signal en_cali will trigger the calibration enable in such a manner that the circuit to be calibrated enter the calibration mode. That is, the common mode voltage is provided to the non-inverting input terminal and the inverting input terminal of the circuit to be calibrated. A variable rising_edge_num is the number of recorded times of the rising edge of the signal en_cali, and different subsequent actions will be triggered depending on different values of rising_edge_num. When the rising_edge_num is equal to 0 (the calibration mode is not entered after power-on), a variable offset_tune_data is equal to 0, the variable offset_tune_data is a calibration code value fed back to an offset input terminal of the circuit to be calibrated, and the digital calibration method provided by the embodiment of the present disclosure interacts with an analog domain (i.e., a circuit structure) at least through the variable offset_tune_data (i.e., the calibration code value). In the present embodiment, the offset_tune_data can be designed as a 5-bit binary value, that is, the maximum value of the offset_tune_data is 15. When the rising_edge_num is equal to 1, it is indicated that a first calibration is performed after the power-on, the offset_tune_data is reset to 0, and a signal offset_algsel (an external control signal used to select a calibration algorithm) is assigned to a variable comp_algsel (selection of the calibration algorithm). When the rising_edge_num is larger than 1 (that is, it is not the first calibration after the power-on), only the assigning of the signal offset_algsel to the variable comp_algsel is performed.

(2) When an external signal offset_tune_data multi (indicating a selection method of the calibration code value) is equal to 1, the offset_tune_data will select the calibration code value finally determined in the last round of calibration as the initial value of the calibration code for this round, which is especially suitable for real-time calibration and can converge faster. When the offset_tune_data multi is not equal to 1, the offset_tune_data will be reset, and a reset value 0 is selected as the initial value of the calibration code for this round.

(3) When the variable offset_tune_data is greater than or equal to 16 (that is, the binary is 10000, and it should be noted that in the present embodiment, the first digit of the variable offset_tune_data indicates the compensation made to positive or negative of the offset of the circuit to be calibrated, 1 indicates positive, and 0 indicates negative, and the last four digits indicate an absolute value of the compensation value), an variable offset_positive_flag is set to be equal to 1 (the variable offset_positive_flag indicates the positive or negative of the offset that is added to the circuit to be calibrated, 1 indicates positive, and 0 indicates negative). When the offset_tune_data is smaller than 16, the offset_positive_flag is equal to 0 (the offset input to the circuit to be calibrated is negative).

(4) An initialization assignment and determining the calculation formula are performed and include: ① determining a calculation formula of an intermediate variable offset_cnt of the calibration code value: the formula is offset_cnt=01111&&offset_tune_data; ② determining the calculation formula for a variable upper limit and a variable lower limits of the number of "0" counts in each round (that is, in a case where the circuit to be calibrated keeps receiving the same calibration code value signal): based on a variable offset_cal_acc_cycle obtained by counting the total number of times of "0" for calculation in each round and a pre-configured variable offset_converg_range (indicating the variable range of a calculated number of times of "0" in each round, which is equivalent to pre-configuring the error of the output result of the circuit to be calibrated), a variable offset_high_limit (indicating the upper limit of a counted number of times of "0" in each round) and a variable offset_low_limit (indicating the lower limit of a counted number of times of "0" in each round) are calculate and obtain through the calculation formulas:

offset_high_limit=offset_cal_acc_cycle/2+offset_converg_range, and offset_low_limit=offset_cal_acc_cycle/2-offset_converg_range;

③ an initial value of a variable offset_finish_algnormal_mid used to indicate which algorithm is used for convergence is assigned to be 0; ④ an initial value of an intermediate variable offset_done_mid used to indicate a calibration end signal is assigned to be 0; ⑤ an initial value of a variable adjust_direction_flag used to indicate an adjustment direction of the calibration code value is assigned to be 0.

(5) After assigning values and determining the formulas, multiple rounds of test of the calibration result is started, and in each round of the test, the offset calibration code input terminal of the circuit to be calibrated keeps to be input the same calibration code value, in each round of the test, the output of the circuit to be calibrated is tested multiple times, and the output of the circuit to be calibrated can be 0 or 1. Specifically, in the programs, a for-loop of a variable comp_cal_loop_i (a variable used to express the number of calibration rounds) is started, stepping is started from 1 to a pre-configured value offset_cal_loop, and the value is incremented by 1 for each stepping. In each round of calibration, the test will be executed multiple times, and the number of times of occurrences of "0" is counted. Specifically, in each round of calibration, variable are reset first, the variable offset_zero_cnt indicating the number of times of the occurrence of 0 in the output result of the circuit to be calibrated is reset to 0, and the variable offset_tune_data is assigned to the intermediate variable offset_tune_data_pre (used to save the calibration code value used in this round of calibration); then, another for-loop i.e., a sampling loop, is entered, in which the output of the circuit to be calibrated is sampled, a variable "point" indicating the number of sampling times is stepped from 1 to offset_cal_acc_cycle, the stepping value is added by 1, and each time when the sampling result is 0, the number of times of the variable offset_zero_cnt is increased by 1, in this way, after the sampling loop ends, the variable offset_zero_cnt is the number of times when the sampling result is "0" in this round of calibration. The sampling loop can be triggered by an analog domain trigger signal from a clock signal output terminal, for example, the sampling is triggered by a rising edge of a clock.

(6) After this round of sampling is finished, if the variable offset_zero_cnt is within a range [offset_low_limit, offset_high_limit], it indictes that the test result is within an allowable error range, and following assignment is performed: assigning the variable offset_done_mid to be 1 and the variable offset_finish_algnormal_mid to be 2. When the offset_zero_cnt is greater than the offset_high_limit, a Zone_A processing module as shown in FIG. 3 is entered, in order to change the calibration code value input to the circuit to be calibrated using a processing method illustrated in the Zone_A processing module, and the next round of testing is performed. When the offset_zero_cnt is smaller than the offset_low_limit, a Zone_B processing module shown in FIG. 4 is entered, in order to change the calibration code value input to the circuit to be calibrated using a processing method illustrated in the Zone_B processing module, and the next round of testing is performed.

(7) A process of the Zone_A module (as shown in FIG. 3) is as follows. Whether the variable offset_positive_flag is equal to 0 is judged. If the variable offset_positive_flag is not equal to 0, the offset_positive_flag is assigned to be 1 and the offset_cnt is added by 1 on its original basis, and the offset_cnt value is further judged, and if the offset_cnt is greater than or equal to 15, the offset_cnt is assigned to be 15 and then a step A is performed, and if the offset_cnt is smaller than 15, the step A is performed. If the offset_positive_flag is determined to be equal to 0, the value of the offset_cnt is further determined, and then if the offset_cnt is not equal to 0, the offset_positive_flag is assigned to be 0 and the offset_cnt is subtracted by 1 on its original basis, and then the step A is performed; and if the offset_cnt is equal to 0, then the offset_positive_flag is assigned to be 1 and the offset_cnt remains unchanged, and then the step A is performed. At step A, whether the variable comp_cal_loop_i of the number of calibration rounds is not equal to 1 and the variable adjust_direction_flag of the adjustment direction of the calibration code value is equal to 0 is judged. If "the comp_cal_loop_i is not equal to 1 and the adjust_direction_flag is equal to 0" is true, it is determined whether the comp_algsel is equal to 1, and if the comp_algsel is equal to 1, the adjust_direction_flag is assigned to be 1, the offset_finish_algnormal_mid is assigned to be 1, and the offset_done_mid is assigned to be 1; and if the comp_algsel is not equal to 1, the adjust_direction_flag is assigned to be 1, the offset_finish_algnormal_mid is assigned to be 0, and the offset_done_mid is assigned to be 0. If it is determined that "the comp_cal_loop_i is not equal to 1 and the adjust_direction_flag is equal to 0" is not true, then the adjust_direction_flag is assigned to be 1, the offset_finish_algnormal_mid is assigned to be 0, and the offset_done_mid is assigned to be 0.

(8) A process of the Zone_B module (as shown in FIG. 4) is as follows. If the variable offset_positive_flag is equal to 0, the offset_positive_flag is assigned to be 0 and the offset_cnt is added by 1 on its original basis, and the offset_cnt value is further judged, and if the offset_cnt is greater than or equal to 15, the offset_cnt is assigned to be 15, and if the offset_cnt is smaller than 15, judging of the variable comp_cal_loop_i and the variable adjust_direction_flag is directly performed. If the offset_positive_flag is not equal to 0, the value of the offset_cnt is further judged, and then if the offset_cnt is not equal to 0, the offset_positive_flag is equal to 1 and the offset_cnt is reduced by 1 on its original basis; and if the offset_cnt is equal to 0, then the offset_positive_flag is equal to 0 and the offset_cnt remains unchanged, and then judging of the variable comp_cal_loop_i and the variable adjust_direction_flag is performed. If "the comp_cal_loop_i is not equal to 1 and the adjust_direction_flag is equal to 1" is true, the comp_algsel is judged. If the comp_algsel is equal to 1, the adjust_direction_flag is equal to 0, the offset_finish_algnormal_mid is equal to 1, and the offset_done_mid is equal to 1. If the comp_algsel is not equal to 1, the adjust_direction_flag is equal to 0, the offset_finish_algnormal_mid is equal to 0, and the offset_done_mid is equal to 0. If it is determined that "the comp_cal_loop_i is not equal to 1 and the adjust_direction_flag is equal to 1" is not true, the adjust_direction_flag is equal to 0, the offset_finish_algnormal_mid is equal to 0, and the offset_done_mid is equal to 0.

(9) when the offset_finish_algnormal_mid is not equal to 1, the offset_tune_data, the offset_cal_loop use, the offset_zero_cnt, the offset_finish_algnormal, and the offset_done are respectively refreshed according to following assignment formulas:

offset_tune_data=offset_positive_flag*16+offset_cnt;

offset_cal_loop use=comp_cal_loop_i;

offset_zero_cnt=offset_zero_cnt;

offset_finish_algnormal=offset_finish_algnormal_mid; and offset_done=offset_done_mid.

After refreshing the assignment formulas, it is continued to judge the value of the offset_finish_algnormal_mid:

if the offset_finish_algnormal_mid is not equal to 2, the calibration is continued to be performed and the next round of calibration is started; and if the offset_finish_algnormal_mid is equal to 2, the calibration is over, to jump out of the loop.

when the offset_finish_algnormal_mid is equal to 1, the offset_tune_data, the offset_cal_loop use, the offset_zero_cnt, the offset_finish_algnormal, and the offset_done are respectively refreshed according to following assignment formulas:

offset_tune_data=offset_tune_data_pre;

offset_cal_loop use=comp_cal_loop_i;

offset_zero_cnt=offset_zero_cnt;

offset_done=offset_done_mid;

offset_finish_algnormal=offset_finish_algnormal_mid. (It should be noted that the assignment formula of the offset_tune_data when the offset_finish_algnormal_mid is equal to 1 is different from the assignment formula of the offset_tune_data when the offset_finish_algnormal_mid is not equal to 1) And the calibration is over, to jump out of the loop.

The digital calibration method provided by the present embodiment calibrates the compensation of the circuit to be calibrated. Each test compensation calibration code value is sampled, tested and output multiple times, and whether a current test compensation calibration code value can make the circuit to be calibrated meet specified accuracy is judged according to a probability that the output result is the target result. Through sampling each test compensation calibration code multiple times, the selected compensation calibration code has higher accuracy, thereby solving the problem of the low calibration accuracy of the circuit for calibrating compensation in the prior art.

It should be noted that the terminals referred to in the embodiments of the present disclosure can include, but are not limited to, personal computers (PC), personal digital assistants (PDA), wireless handheld devices, tablet computers, mobile phones, MP3 players, MP4 players, etc.

It can be understood that the application can be an application (nativeApp) installed on the terminal, or it can also be a webpage program (webApp) of a browser on the terminal, which is not limited in the present embodiment of the present disclosure.

Embodiment Two

The embodiment of the present disclosure further provides an embodiment of a device that implement the steps and method in the above method embodiment. It should be noted that the execution subject of the above method embodiment can be the digital calibration device provided by the embodiment of the present disclosure, and the device can be located in an application of a local terminal, or it can also be a functional unit such as a plug-in or a software development kit (SDK) located in the application of the local terminal, which is not particularly limited in the embodiment of the present disclosure.

Figure 5:
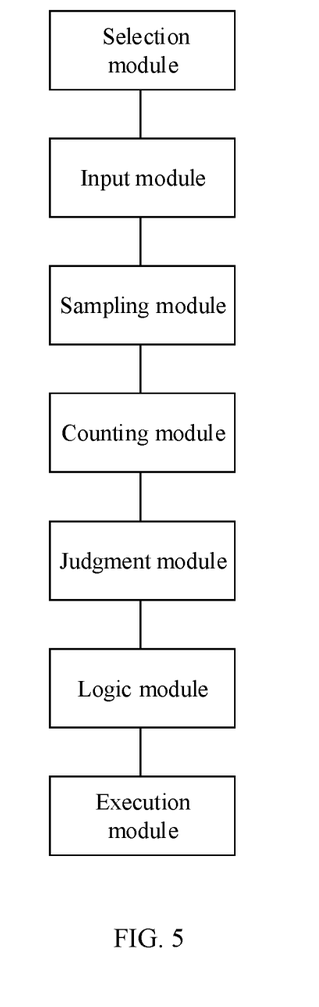
FIG. 5 is an example diagram of a digital calibration device provided by an embodiment of the present disclosure.

FIG. 5 is a functional block diagram of the digital calibration device provided by an embodiment of the present disclosure. As shown in FIG. 5, the device includes a selection module, an input module, a sampling module, a counting module, a judgment module, a logic module and an execution module.

The selection module is configured to select, in a case where a circuit to be calibrated is in a calibration mode, a first value from a first range as a test compensation calibration code value for a current test. The circuit to be calibrated is a comparator or operational amplifier of an analog-to-digital converter. A common mode voltage is provided to a non-inverting input terminal and an inverting input terminal of the circuit to be calibrated in the case where the circuit to be calibrated is in the calibration mode. The input module is configured to input the test compensation calibration code value to a compensation calibration code input terminal of the circuit to be calibrated. The sampling module is configured to sample output of the circuit to be calibrated specified times. The counting module is configured to count a number of times when the output of the circuit to be calibrated is a target result within the specified times, to obtain a second value. The judgment module is configured to judge whether the second value is within a second range. The logic module is configured to take the test compensation calibration code value as a compensation calibration code of the circuit to be calibrated in an operating mode if the second value is within a second range. The execution module is configured to, if the second value is not within a second range, select a third value from the first range in a preset order as a test compensation calibration code value for a next test until the second value is within the second range.

Optionally, the judgment module is also configured to, before selecting the third value from the first range in a preset order as the test compensation calibration code value for the next test, judge whether second values obtained in two adjacent tests are located at different sides of the second range. If the second values obtained in the two adjacent tests are located at different sides of the second range, a test compensation calibration code value of a previous test of the two adjacent tests is taken as the compensation calibration code of the circuit to be calibrated in the operating mode. If the second values obtained in the two adjacent tests are not located at different sides of the second range, the third value from the first range is selected in the preset order as the test compensation calibration code value for the next test.

Optionally, in the case where the calibration mode is triggered by a target signal, the logic module is also configured to count the number of times when the target signal is received after the power-on, to obtain the fourth value. In a case where the fourth value is not greater than 1, the first value is the pre-specified initial value. In a case where the fourth value is greater than 1, the next value corresponding to the current compensation calibration code is selected from the first range in a preset order as the test compensation calibration code value for the current test.

Optionally, the circuit to be calibrated is a comparator or operational amplifier of one of the multiple analog-to-digital converters of the pipelined analog-to-digital converter circuit, and in the case where the calibration mode enable terminal of the pipelined analog-to-digital converter circuit receives the target signal, all circuits to be calibrated of the pipelined analog-to-digital converter circuit enter the to-be-calibrated mode synchronously.

Optionally, the device further includes a determination module, and the determination module is configured to determine, before judging whether the second value is within the second range, an upper threshold and a lower threshold of the second range according to the preset error and the number of the specified times.

Optionally, the test compensation calibration code value includes multiple calibration bits and one symbol identification bit, the multiple calibration bits are used to indicate the numerical magnitude of the test compensation calibration code value, and the symbol identification bit is used to indicate the positive or negative of the test compensation calibration code value.

Since respective modules in the present embodiment can execute the method shown in FIG. 1, parts that are not described in detail in the present embodiment can be referred to the related description of FIG. 1.

The technical solutions of the embodiments of the present disclosure have the following beneficial effects.

Each test compensation calibration code value is sampled and tested multiple times, and whether a current test compensation calibration code value can make the circuit to be calibrated meet specified accuracy is judged according to a probability that the output result is a target result. Through sampling each test compensation calibration code multiple times, the selected compensation calibration code has higher accuracy, thereby solving the problem of the low calibration accuracy of the circuit for calibrating compensation in the prior art.

Embodiment Three

Figure 6:
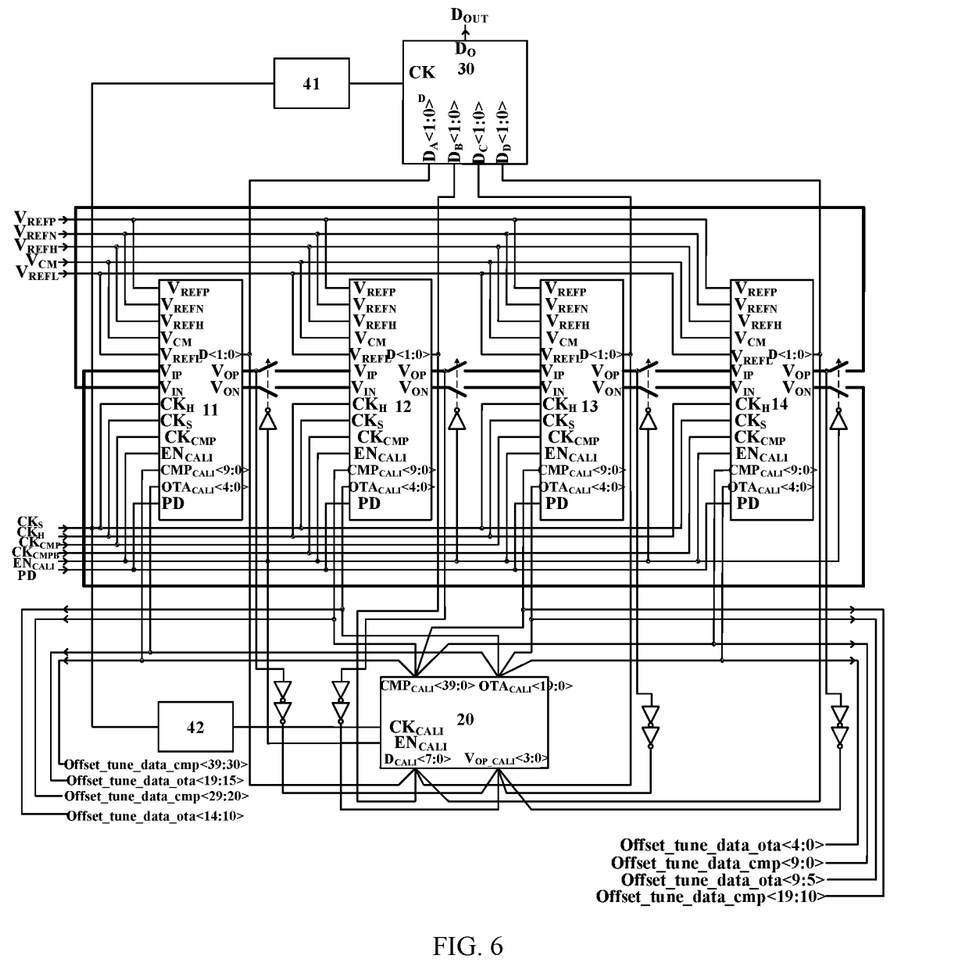
FIGS. 6 to 7 are example diagrams of a true random number generator circuit provided by embodiments of the present disclosure.

The embodiment of the present disclosure provides a true random number generator circuit. FIG. 6 is an example diagram of the true random number generator circuit provided by an embodiment of the present disclosure. As shown in FIG. 6, the true random number generator circuit includes a pipelined analog-to-digital converter circuit (including four analog-to-digital converters that are cascaded, i.e., an analog-to-digital converter 11, an analog-to-digital converter 12, an analog-to-digital converter 13, an analog-to-digital converter 14), a digital calibration device 20 and an output circuit 30. The four-stage cascaded analog-to-digital converters of the pipelined analog-to-digital converter circuit can be a 1.5b/level analog-to-digital converter.

As shown in FIG. 6, the four analog-to-digital converters are connected based on pipelined connection, and input pins $V_{IP}$ and $V_{IN}$ of each analog-to-digital converters are respectively connected to output pins $V_{OP}$ and $V_{ON}$ of another analog-to-digital converter. The analog-to-digital converter 11, the analog-to-digital converter 12, the analog-to-digital converter 13, and the analog-to-digital converter 14 are of the same model, and taking the analog-to-digital converter 11 as an example, pins $V_{REFP}$, $V_{REFN}$, $V_{REFH}$, $V_{CM}$ and $V_{REFL}$ are respectively connected to signals $V_{REFP}$, $V_{REFN}$, $V_{REFH}$, $V_{CM}$ and $V_{REFL}$, and pins $CK_S$, $CK_H$, $CK_{CMP}$, $CK_{CMPB}$, $EN_{CALI}$ and PD are respectively connected to signals $CK_H$, $CK_S$, $CK_{CMP}$, $CK_{MPB}$, $EN_{CALI}$ and PD. Pins $CMP_{CALI}<9:0>$ of the analog-to-digital converter 11, the analog-to-digital converter 12, the analog-to-digital converter 13 and the analog-to-digital converter 14 (<9:0> indicates that this pin is a signal of 10 bits from 0 to 9, the same below) are respectively connected to signals Offset_tune_data_cmp<39:30>, Offset_tune_data_cmp<29:20>, Offset_tune_data_cmp<19:10> and Offset_tune_data_cmp<9:0>. Pins $OTA_{CALI}<4:0>$ of the analog-to-digital converter 11, the analog-to-digital converter 12, the analog-to-digital converter 13 and the analog-to-digital converter 14 are respectively connected to signals Offset_tune_data_ota<19:15>, Offset_tune_data_ota<14:10>, Offset_tune_data_ota <9:5> and Offset_tune_data_ota<4:0>. Output terminals D<1:0> of the analog-to-digital converter 11, the analog-to-digital converter 12, the analog-to-digital converter 13 and the analog-to-digital converter 14 are respectively connected to input pins $D_A<1:0>$, $D_B<1:0>$, $D_C<1:0>$ and $D_D<1:0>$ of the output circuit 30. A pin $CMP_{CALI}<39:0>$ of the digital calibration device 20 is connected to the pins $CMP_{CALI}<9:0>$ of the four analog-to-digital converters, and a pin $OTA_{CALI}<19:0>$ of the digital calibration device 20 is connected to the pins $OTA_{CALI}<4:0>$ of the four analog-to-digital converters. An output signal of an output pin Do of the output circuit 30 is $D_{OUT}$. A clock signal pin $CK_{CALI}$ of the digital calibration device 20 is connected to a delay circuit 42, then to a delay circuit 41, and then to a clock signal pin CKD of the output circuit 30. A rising edge of a pin $EN_{CALI}$ of the digital calibration device 20 triggers acquisition of the output signal of each analog-to-digital converter. A pin $D_{CALI}<7:0>$ of the digital calibration device 20 is connected to the output terminals D<1:0> of the analog-to-digital converter 12, the analog-to-digital converter 13 and the analog-to-digital converter 14, and a pin $V_{OP}<3:0>$ of the digital calibration device 20 is connected to the output pins $V_{OP}$ of the analog-to-digital converter 12, the analog-to-digital converter 13, and the analog-to-digital converter 14. It should be noted that there are pins and signals with the same label in FIG. 6, marks inside the circuit are pins, data lines with arrows are signals, and arrow directions indicate signal directions.

The digital calibration device is connected to each circuit to be calibrated and configured to execute the digital calibration method provided in the Embodiment 1 for each circuit to be calibrated. Optionally, the digital calibration method includes following steps.

At step 11, in a case where the circuit to be calibrated is in the calibration mode, a first value is selected from a first range as a test compensation calibration code value for a current test. The circuit to be calibrated is a comparator or operational amplifier in an analog-to-digital converter, and in the case where the comparator is in the calibration mode, the non-inverting input terminal and the inverting input terminal of the comparator are connected to the same voltage source, and in the case where the operational amplifier is in calibration mode, the non-inverting input terminal and the inverting input terminal of the operational amplifier are connected in common mode.

At step 12, the test compensation calibration code value is input into the compensation calibration code input terminal of the circuit to be calibrated.

At step 13, the output of the circuit to be calibrated is sampled specified times.

At step 14, the number of times when the output of the circuit to be calibrated is the target result within the specified times is counted to obtain a second value.

At step 15, whether the second value is within the second range is judged.

At step 16, if the second value is within the second range, the test compensation calibration code value is taken as the compensation calibration code of the circuit to be calibrated in an operating mode.

At step 17, if the second value is within the second range, a third value is selected from the first range in a preset order, as a test compensation calibration code value for a next test, until the second value is within the second range.

The output circuit is connected with the outputs of multiple analog-to-digital converters, for outputting true random numbers based on the output signals of the multiple analog-to-digital converters.

Figure 7:
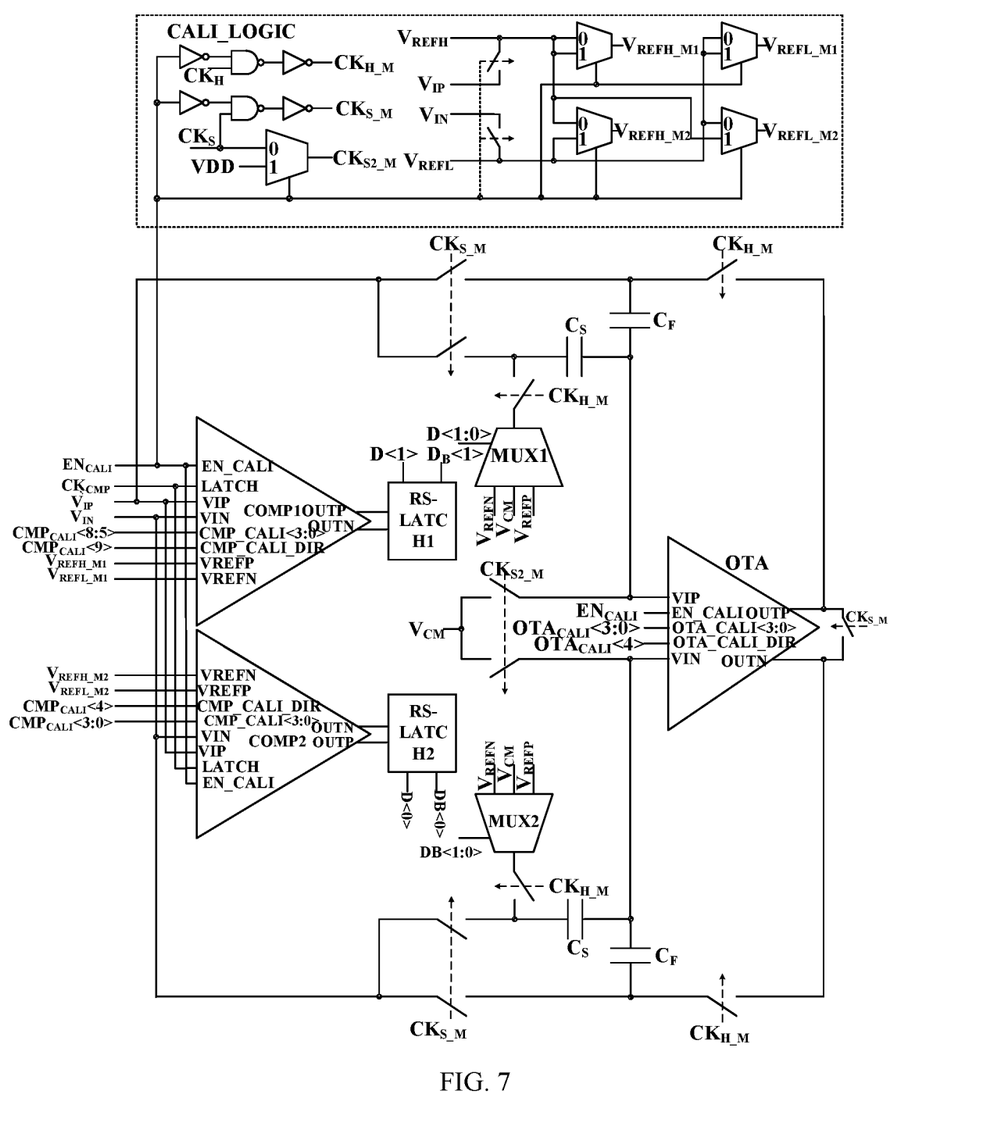

Optionally, a schematic diagram of an internal circuit of each 1.5b/level analog-to-digital converter can be as shown in FIG. 7, and the analog-to-digital converter includes two comparators COMP1 and COMP2, two RS latches RS-LATCH1 and RS-LATCH2, two reference voltage selectors MUX1 and MUX2, an operational amplifier OTA and a calibration logic circuit CALI_LOGIC, thus, each 1.5b/level analog-to-digital converter includes three circuits to be calibrated, i.e., two comparators and one operational amplifier.

For the true random number generator provided in the present embodiment, a process of compensation and calibration requires interaction and cooperation between the analog domain and the digital domain: CALI_LOGIC is implemented in the analog domain (an analog circuit is used to implement that the comparator is in different modes when the signal EN_CALI is at different levels, and a principle is that through combination of Exclusive-OR gate circuits, the connection methods between the signals $V_{REFH}$ and $V_{REFL}$ and the pins $V_{REFH}$ and $V_{REFL}$ are different when the EN_CALI is at different levels,), and the digital calibration method is implemented in the digital domain.

(1) When the EN_CALI is equal to 0, the circuit enters the normal operating mode:

At this time, $V_{REFP}$ and $V_{REFN}$ of a P-terminal comparator are connected to $V_{REFH}$ and $V_{REFL}$ respectively, $V_{REFP}$ and $V_{REFN}$ of a N-terminal comparator are connected to $V_{REFL}$ and $V_{REFH}$ respectively, and differential input $V_{IP}$, $V_{IN}$ and $V_{REFH}$, $V_{REFL}$ are disconnected from each other, which indicates that the comparator is in a normal working state.

At this time, the clocks $CK_{H\_M}$, $CK_{S\_M}$ and $CK_{S2\_M}$ are connected to $CK_H$, $CK_S$ and $CK_S$ respectively, which indicates that the operational amplifier is in a closed-loop architecture and is in normal working state.

(2) When the EN_CALI is equal to 1, the circuit enters the calibration mode:

At this time, the $V_{REFP}$ and $V_{REFN}$ of the P-terminal comparator are connected to $V_{REFH}$ and $V_{REFL}$ respectively, the $V_{REFP}$ and $V_{REFN}$ of the N-terminal comparator are connected to $V_{REFH}$ and $V_{REFL}$ respectively, the differential inputs $V_{IP}$ and $V_{IN}$ are shorted to $V_{REFH}$ and $V_{REFL}$ respectively, which indicates that the input signal of the comparator is shorted to a reference voltage, and the compensation of the comparator will be reflected from a position of a flip edge of a comparison result. The digital domain circuit will provide the calibration code value to the analog domain after repeated iterations according to the calibration algorithm, thereby reducing the compensation.

At this time, the clocks $CK_{H\_M}$, $CK_{S\_M}$ and $CK_{S2\_M}$ are connected to 0, 0 and 1, respectively, it means that the differential input of the op amp is always shorted to the common mode Wm, And the op amp is connected to an open-loop architecture, the compensation of the op amp will be amplified by the open-loop gain, so that one end of the op amp output is pulled close to a high level, and one end is pulled close to a low level. The digital domain circuit will provide the calibration code value to the analog domain after repeated iterations according to the calibration algorithm, thereby reducing the compensation.

Those skilled in the art can clearly understand that, for convenience and conciseness of description, the specific working process of the system, the device and the unit described above can be referred to the corresponding process in the foregoing method embodiment, and it will not be repeated here.

In the several embodiments provided in the present disclosure, it should be understood that the disclosed system, device, and method can be implemented in other ways. For example, the device embodiments described above are only illustrative. For example, division of the unit is only one kind of logical function division, and there may be other division methods in actual implementation. For example, multiple units or components may be combined or integrated into another system, or some features may be omitted or not implemented. In addition, the displayed or discussed mutual coupling or direct coupling or communication connection can be realized through some interfaces, and indirect coupling or communication connection of the devices or units can be in electrical, mechanical or other forms.

The units described as separate components may or may not be physically separate, components displayed as units may or may not be a physical unit, that is, they may be located in one place, or they may be distributed on multiple network units. Some or all of the units may be selected according to actual needs to achieve the objectives of the solutions of the embodiments.

In addition, respective functional units in the respective embodiments of the present disclosure can be integrated into one processing unit, or it is possible that the respective units may exist alone physically, or two or more units may be integrated into one unit. The above-mentioned integrated units may be implemented in the form of hardware or may be implemented in the form of hardware and software functional units.

The above-mentioned integrated unit implemented in the form of a software functional unit may be stored in a computer readable storage medium. The above-mentioned software functional unit is stored in a storage medium and includes several instructions to make a computer device (which can be a personal computer, a server, or a network device, etc.) or a processor (Processor) execute part of the steps of the method described in the various embodiments of the present disclosure. The aforementioned storage media include U disks, mobile hard disks, read-only memories (ROM), random access memories (RAM), magnetic disks or optical disks and other media that can store program codes.

The above descriptions are only preferred embodiments of the present disclosure and are not intended to limit the present disclosure. Any modification, equivalent replacement, improvement, etc. made within the spirit and principle of the present disclosure shall be included in the scope of protection of the present disclosure.

What is claimed is:

1. A digital calibration method, comprising:
in a case where a circuit to be calibrated is in a calibration mode, selecting a first value from a first range as a test compensation calibration code value for a current test, wherein the circuit to be calibrated is a comparator or operational amplifier of an analog-to-digital converter, wherein a common mode voltage is provided to a non-inverting input terminal and an inverting input terminal of the circuit to be calibrated;
inputting the test compensation calibration code value to a compensation calibration code input terminal of the circuit to be calibrated;

sampling output of the circuit to be calibrated specified times;
counting a number of times when the output of the circuit to be calibrated is a target result within the specified times, to obtain a second value;
judging whether the second value is within a second range; and
if the second value is within a second range, taking the test compensation calibration code value as a compensation calibration code of the circuit to be calibrated in an operating mode.

2. The method according to claim 1, further comprising:
if the second value is not within a second range, selecting a third value from the first range in a preset order as a test compensation calibration code value for a next test, until the second value is within the second range.

3. The method according to claim 1, further comprising, prior to the selecting the third value from the first range in the preset order as the test compensation calibration code value for the next test:
judging whether second values obtained in two adjacent tests are located at different sides of the second range; and
if the second values obtained in the two adjacent tests are located at different sides of the second range, taking a test compensation calibration code value of a previous test of the two adjacent tests as the compensation calibration code of the circuit to be calibrated in the operating mode.

4. The method according to claim 3, further comprising:
if the second values obtained in the two adjacent tests are not located at different sides of the second range, selecting the third value from the first range in the preset order as the test compensation calibration code value for the next test.

5. The method according to claim 1, wherein when the calibration mode is triggered by a target signal, the selecting the first value from the first range as the test compensation calibration code value for the current test comprises:
counting a number of times when the target signal is received after power-on, to obtain a fourth value;
setting the first value to be a pre-specified initial value in a case where the fourth value is not greater than 1; and
selecting a next value corresponding to a current compensation calibration code from the first range in the preset order as the test compensation calibration code value for the current test in a case where the fourth value is greater than 1.

6. The method according to claim 5, wherein the circuit to be calibrated is a comparator or operational amplifier of one of a plurality of analog-to-digital converters of a pipelined analog-to-digital converter circuit, and when a calibration mode enable terminal of the pipelined analog-to-digital converter circuit receives the target signal, all circuits to be calibrated of the pipelined analog-to-digital converter circuit enter a to-be-calibrated mode synchronously.

7. The method according to claim 1, further comprising, prior to the judging whether the second value is within the second range:
determining an upper threshold and a lower threshold of the second range based on a preset error and a number of the specified times.

8. The method according to claim 1, wherein the test compensation calibration code value comprises a plurality of calibration bits and a symbol identification bit, wherein the plurality of calibration bits indicates numerical magnitude of the test compensation calibration code value, and the symbol identification bit indicates positive or negative of the test compensation calibration code value.

9. A digital calibration device, comprising:
a selection module configured to select, in a case where a circuit to be calibrated is in a calibration mode, a first value from a first range as a test compensation calibration code value for a current test, wherein the circuit to be calibrated is a comparator or operational amplifier of an analog-to-digital converter, wherein a common mode voltage is provided to a non-inverting input terminal and an inverting input terminal of the circuit to be calibrated in the case where the circuit to be calibrated is in the calibration mode;
an input module configured to input the test compensation calibration code value to a compensation calibration code input terminal of the circuit to be calibrated;
a sampling module configured to sample output of the circuit to be calibrated specified times;
a counting module configured to count a number of times when the output of the circuit to be calibrated is a target result within the specified times, to obtain a second value;
a judgment module configured to judge whether the second value is within a second range; and
a logic module configured to take the test compensation calibration code value as a compensation calibration code of the circuit to be calibrated in an operating mode if the second value is within a second range.

10. The device according to claim 9, further comprising an execution module configured to select a third value from the first range in a preset order as a test compensation calibration code value for a next test until the second value is within the second range if the second value is not within a second range.

11. A true random number generator circuit, comprising:
a pipelined analog-to-digital converter circuit, wherein the pipelined analog-to-digital converter circuit comprises a plurality of analog-to-digital converters connected in a pipelined connection manner, each of the plurality of analog-to-digital converters comprises a plurality of circuits to be calibrated, and each of the plurality of circuits to be calibrated is a comparator or operational amplifier;
a digital calibration device connected to each of the plurality of circuits to be calibrated and configured to execute the digital calibration method according to claim 1 for each of the plurality of circuits to be calibrated; and
an output circuit connected to outputs of the plurality of analog-to-digital converters and configured to output a true random number based on output signals of the plurality of analog-to-digital converters.

12. The true random number generator circuit according to claim 11, wherein each of the plurality of analog-to-digital converters further comprises:
a first calibration logic circuit configured to, when a calibration mode enable terminal receives a target signal, provide the common-mode voltage to a non-inverting input terminal and an inverting input terminal of each of the plurality of operational amplifiers in such a manner that each of the plurality of operational amplifiers is in a calibration mode; and
a second calibration logic circuit configured to, when the calibration mode enable terminal receives the target signal, provide the common-mode voltage to a non-inverting input terminal and an inverting input terminal of each of the plurality of comparators in such a manner that each of the plurality of comparators is in the calibration mode.

13. The true random number generator circuit according to claim 12, wherein the digital calibration device comprises:
a plurality of digital calibration modules respectively connected to the plurality of circuits to be calibrated in one-to-one correspondence, each of the plurality of digital calibration modules being configured to execute the digital calibration method for a correspondingly connected circuit to be calibrated of the plurality of circuits to be calibrated.

* * * * *